May 28, 1957 R. F. SHEA 2,794,076

TRANSISTOR AMPLIFIERS

Filed May 5, 1952 2 Sheets-Sheet 1

Inventor:
Richard F. Shea,
by Merton D. Morse
His Attorney.

May 28, 1957 R. F. SHEA 2,794,076

TRANSISTOR AMPLIFIERS

Filed May 5, 1952 2 Sheets-Sheet 2

Inventor:
Richard F Shea,
by Merton D Moore
His Attorney.

2,794,076
Patented May 28, 1957

2,794,076

TRANSISTOR AMPLIFIERS

Richard F. Shea, Syracuse, N. Y., assignor to General Electric Company, a corporation of New York Application May 5, 1952, Serial No. 286,103
12 Claims. (Cl. 179—171)

Figure 1:
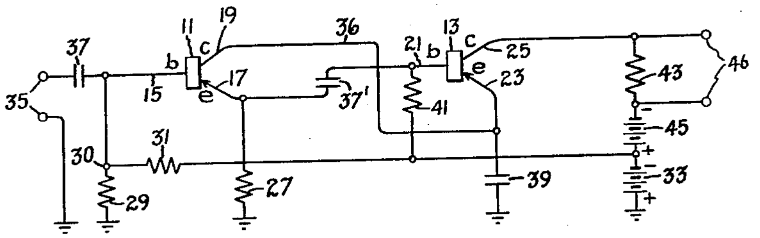

My present invention relates generally to semi-conductor amplifiers, and more particularly to plural-stage tandem-coupled power amplifiers of the transistor type.

Transistor amplifiers heretofore described have suffered an inherent disadvantage in that stabilization of the operating points of the transistors has been difficult to achieve without severely limiting the efficiency thereof. Instability or shifting of the operating point results from variation of the collector current at zero emitter current, hereinafter designated $I_{co}$ which variation, for a given transistor, occurs mainly as a function of temperature. Such instability is also observed to occur between different transistor units, thus rendering free substitution or replacement of units in established circuits extremely difficult to accomplish.

The variation of collector current at zero emitter current $I_{co}$ with temperature may be as great as 10 to 1 and can produce similar variations in the operating current in the collector circuit of a transistor, and can also produce undesirable saturation condition in the sense that the voltage drop across the transistor becomes negligible as compared to the voltage drop across a load resistance in circuit with the transistor, thereby producing a serious loss of performance as by distortion or reversal of the transistor collector current.

Furthermore, shifting of the operating point can, in power amplifiers, result in an increase in internal heating of the transistor, which in turn, can be cumulative or regenerative with the result that the amplifier may "run away" making it virtually impossible to effect operation at a preselected operating point.

A principal object of my invention is, accordingly, the provision of an amplifier circuit using semi-conductor devices or transistors in which a high degree of stabilization of the operating point is achieved with relatively little loss in efficiency.

Another object is to provide a stabilized transistor amplifier wherein a constant-current source for the emitter and a constant-voltage source for the collector are provided without excessive power losses commonly experienced through the use of battery-voltage supplies and a high series resistance.

Another object is to provide a multi-stage amplifier employing transistor devices and wherein the first stage is operated for stabilization purposes and at a relatively low voltage level, the later stage or stages being operated at relatively high voltage levels, whereby relatively high power output is derived from said amplifier with relatively low power dissipation in the stabilization-producing means.

Still another object of my invention is to provide a plural-stage power amplifier wherein three-electrode semi-conductor elements are cascaded, said amplifier being characterized in that voltage division is achieved among the respective stages with the input stage operating at a relatively low voltage level, whereby a correspondingly low noise factor is obtained.

A further object of the invention resides in the provision of a plural-stage transistor amplifier wherein the first stage is employed to provide a constant-current source for the second stage, said first and said second stages being adapted to contribute to the overall power gain of said amplifier.

The objects of my invention may be realized through the provision of a pair of transistors so arranged in a circuit that one transistor operates to provide a source of constant current for the other. This useful result is accomplished by utilizing the first transistor as a high-impedance constant-current device, the collector current of which, properly stabilized, is employed to drive the second transistor.

In accordance with a further feature of my invention the constants of the circuit are selected so that the first transistor is operated at a relatively low voltage level with respect to the level of the operation of the second transistor, thereby to reduce dissipation of power and the means associated with the first transistor for stabilizing the output thereof.

My invention will be better understood from the following description taken in connection with the accompanying drawings and its scope will be pointed out in the appended claims.

Figure 2:
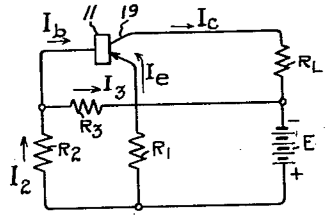
Figure 3:
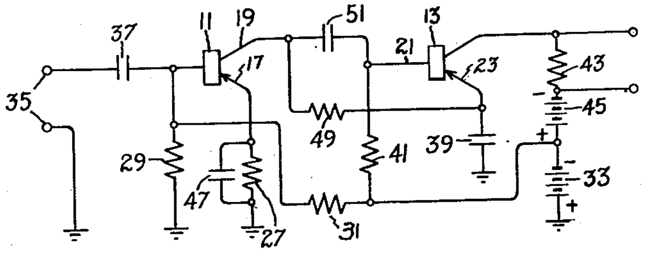
Figure 4:
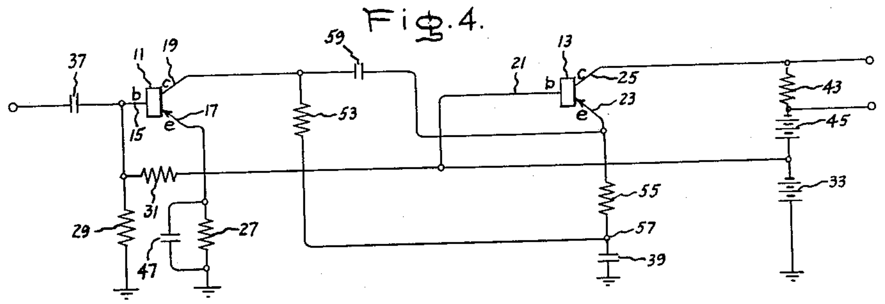
Figure 5:
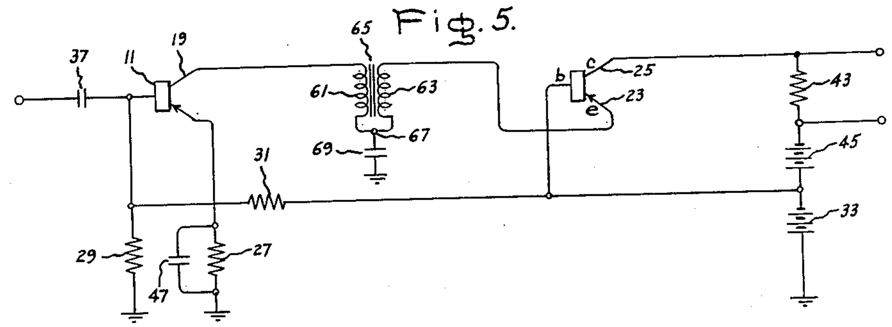
Figure 6:
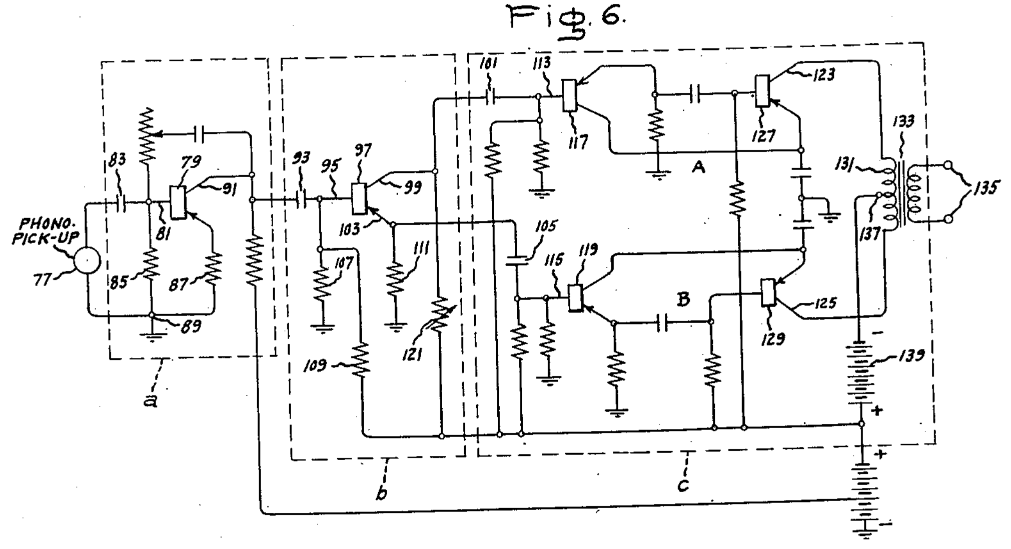

Fig. 1 is a schematic circuit diagram of a power amplifier embodying the novel features of my invention; Fig. 2 is an equivalent circuit diagram corresponding to a part of the amplifier illustrated in Fig. 1; Fig. 3 is a circuit diagram illustrative of a modified form of the amplifier illustrated in Fig. 1; Fig. 4 is a similar diagram of another modification; Fig. 5 is a circuit diagram of a further modification of the power amplifier of the present invention; and Fig. 6 is a circuit diagram of a still further modified form of the power amplifier of my invention.

Fig. 1 shows a single-ended two-stage amplifier comprising a pair of transistors 11 and 13, which may be of the type commonly designated as p–n–p junction transistors consisting, as is known, of an arrangement of two p–n junctions (not shown) arranged back-to-back in a single crystal of germanium, thus to provide a sandwich of two p-type regions separated by an n-type region. Separate electrical connections are made to each region to provide the usual base, emitter and collector electrodes 15, 17 and 19 for transistor 11 and similar electrodes 21, 23 and 25 for transistor 13.

It will be clearly understood, however, that n–p–n junction transistors can be used, if desired, necessitating only a reversal of the terminals of the bias-voltage sources employed, since the latter type is known to operate similarly to the p–n–p type, each type being characterized in that the static characteristics of each exhibit a collector-current versus collector-voltage family of curves that are essentially parallel lines of substantially uniform spacing thus indicating good linearity. As is well known, such transistors have potentially nearly 50% efficiency, inasmuch as a load line can be constructed to swing from almost zero current to zero voltage.

As noted above, such junction transistors have heretofore been difficult to use in amplifier applications because of the very high instability of the collector current at zero emitter current. This instability is especially marked at relatively high powers of transistor operation.

In Fig. 1 signal voltage to be amplified appears between input terminals 35 and is supplied through coupling condenser 37 to the base electrode 15 of transistor 11. This electrode is connected to a point 30 between two resistors 29 and 31 in series across a suitable source of bias, or operating potential 33 the positive terminal of which is grounded. The collector electrode of this transistor 19 is connected directly through conductor 36 to the emitter electrode 23 of transistor 13 and both are connected to ground through bypass condenser 39. The capacitance of this condenser is sufficiently high that substantially no potential variation at frequencies to be amplified appears across it.

Current in emitter electrode 17 of transistor 11 flows through resistance 27, connected between emitter 17 and ground on which the amplified output voltage of the first stage appears. This voltage is supplied through coupling condenser 37' to the base electrode 21 of transistor 13. This base electrode is connected through resistance 41 to the negative terminal of source 33. The output collector electrode 25 of this transistor is connected through a suitable load resistor 43 to the negative terminal of a second suitable source of bias, or operating potential 45, the positive terminal of which is connected to the negative terminal of the first source 33. The amplified output signal potential appears on resistance 43 and is supplied to the output load which may be connected between the terminals 46.

For stabilizing the operating point of the transistor 11 in accordance with this invention, the resistor 27 is provided in the circuit of the emitter 17 and the voltage divider in the form of resistors 29 and 31 connected in series across source 33 having the common junction 30 connected to base electrode 15, is provided.

For consideration of the operation of these elements to provide the desired stabilization, reference may be had to Fig. 2, which is a direct-current circuit generally similar to the circuit associated with transistor 11.

Resistances $R_1$, $R_2$ and $R_3$ of Fig. 2 correspond to the resistors 27, 29 and 31, respectively, of Fig. 1. The collector electrode 19 of the transistor 11 is considered to be connected through a load resistance $R_L$ to the negative terminal of a battery having a voltage E. The load resistance $R_L$, as will appear hereinafter, is equivalent to the transistor 13 and the circuits associated therewith, as illustrated in Fig. 1. The directions of the currents are assumed as indicated by the arrows in Fig. 2, the arrows being identified by corresponding legends I with appropriate subscripts designating the portions of the circuit traversed by the respective currents.

In the analysis that follows, it is assumed that (1) the voltage between the collector and the base $V_c$, hereinafter called the collector-base voltage, is maintained within a range where it negligibly affects the collector current $I_c$; (2) the current amplification factor $\alpha$ is constant over the operating range, $\alpha$ being defined as the rate of change of the collector current with respect to the emitter current with the collector-base voltage constant; and (3) the voltage between the emitter and the base, hereinafter called the emitter-base voltage $V_e$, is zero.

The mesh equations for the circuit of Fig. 2, in view of the foregoing assumption, may be written as follows:

$$I_2R_2 = I_eR_1 = E - I_3R_3 \quad (1)$$

$$I_c = I_b + I_e \quad (2)$$

$$I_b = I_2 - I_3 \quad (3)$$

And from well-known transistor characteristics $$I_c = I_{co} + \alpha I_e \quad (4)$$

where $\alpha$, as defined above, is $$\left(\frac{\partial I_c}{\partial I_e}\right)_{V_c}$$

the use of the subscript $V_c$ designating constancy of $V_c$ and $I_{co}$ is the collector current for $I_e = 0$.

Solving the Equations 1 through 4, the following expressions for the collector, emitter and base currents are derived:

$$I_c = \frac{I_{co}\left(1 + \frac{R_1}{R_2} + \frac{R_1}{R_3}\right) + \frac{\alpha E}{R_3}}{1 - \alpha + \frac{R_1}{R_2} + \frac{R_1}{R_3}} \quad (5)$$

$$I_e = \frac{I_c - I_{co}}{\alpha} \quad (6)$$

$$I_b = \frac{I_{co} - I_c(1-\alpha)}{\alpha} \quad (7)$$

Also, $$I_2 = \frac{\frac{R_1}{R_2}\left(I_{co} + \frac{E}{R_3}\right)}{1 - \alpha + \frac{R_1}{R_2} + \frac{R_1}{R_3}} \quad (8)$$

$$I_3 = \frac{\frac{E}{R_3}\left(1 - \alpha + \frac{R_1}{R_2}\right) - I_{co}\frac{R_1}{R_3}}{1 - \alpha + \frac{R_1}{R_2} + \frac{R_1}{R_3}} \quad (9)$$

Stability factor S may be defined as the ratio of the change of collector current to the change of collector current for zero emitter current. Thus, $$S = \frac{dI_c}{dI_{co}} = \frac{1 + \frac{R_1}{R_2} + \frac{R_1}{R_3}}{1 - \alpha + \frac{R_1}{R_2} + \frac{R_1}{R_3}} \quad (10)$$

For stable operation, the numerical value of the stability factor S should be a minimum for reasonable values of the battery voltage E and power dissipation $P_d$ in the stabilizing resistors $R_1$, $R_2$ and $R_3$.

Expressing the collector current $I_c$ in terms of the stability factor S we have:

$$I_c = SI_{co} + \frac{E}{R_3}(S-1) \quad (11)$$

In operation, there is a desired operating point that determines the voltage $V_c$ between the collector electrode and the base electrode, and the collector current $I_c$. For such a desired operating point and the available supply voltage E, one can calculate the values of the resistors for any desired value of stability factor S, or conversely, the value of S for any fixed set of values of the resistors.

For a desired operating collector-base voltage $V_c$ $$I_e = \frac{E - I_cR_L - V_c}{R_1} \quad (12)$$

By substitution of the relation for $I_e$ in (12) for the similar expression in Equation 6, one derives the following:

$$R_1 = \frac{\alpha(E - R_LI_c - V_c)}{I_c - I_{co}} \quad (13)$$

Equation 11 can be rewritten as follows:

$$R_3 = \frac{E(S-1)}{I_c - SI_{co}} \quad (14)$$

Equation 10 can be rewritten as:

$$R_2 = \frac{R_1R_3(S-1)}{R_3S\alpha - (S-1)(R_1+R_3)} \quad (15)$$

Using the expressions for $R_1$ and $R_3$ from Equations 13 and 14 to derive an expression for $$\frac{R_1}{R_3}$$

and substituting it in Equation 10 and solving, one obtains the following expression for E in terms of $$\frac{R_1}{R_2}$$

$$E = \frac{\alpha(V_c + R_LI_c)(I_c - SI_{co})}{(I_c - I_{co})\left[\frac{R_1}{R_2}(S-1) + S(1-\alpha) - 1\right] + \alpha(I_c - SI_{co})} \quad (16)$$

Substituting the expression for E from (16) into Equation 14 we have:

$$R_3 = \frac{\alpha(V_c + R_LI_c)}{\frac{R_1}{R_2}(I_c - I_{co}) + (I_c - I_{co})(1-\alpha) - I_{co}} \quad (17)$$

The expressions for the stabilizing resistances derived hereinabove are expressible in terms of E as follows:

$$R_1=\frac{\alpha(E-R_LI_c-V_c)}{I_c-I_{co}} \quad (13)$$

$$R_2=\frac{(S-1)}{\frac{(1-S+\alpha S)(I_c-I_{co})}{\alpha(E-V_c-R_LI_c)}-\frac{(I_c-SI_{co})}{E}} \quad (18)$$

$$R_3=\frac{E(S-1)}{I_c-SI_{co}} \quad (19)$$

Thus, for any desired operating point determined by preselected values of $V_c$, $I_c$, $R_L$, desired stability factor S, and any desired battery voltage E, the required stabilizing resistances $R_1$, $R_2$ and $R_3$ can be readily calculated.

It will be noted that the collector current $I_c$ derived from the transistor 11 may be expressed, as in Equation 11 as follows:

$$I_{c_1}=S_1I_{co_1}+\frac{E(S_1-1)}{R_3} \quad (11')$$

in which the added subscript 1 is now employed to indicate that the associated quantity is referred to the first transistor 11. That is, $I_{c_1}$ is the collector current of the transistor 11 and $S_1$ is the stability factor for the first transistor 11. It will be recalled that the resistances $R_1$, $R_2$ and $R_3$ correspond to the resistors 27, 29 and 31 respectively.

Referring again to Fig. 1, it will be seen that the collector current $I_{c_1}$ is directly supplied to the emitter electrode 23 of transistor 13 as by a conductor 36. Thus the emitter current $I_{e_2}$ of the transistor 13 is identical with the collector current $I_{c_1}$ of transistor 11, or $$I_{e_2}=S_1I_{co_1}+\frac{E(S_1-1)}{R_3} \quad (20)$$

An expression for the collector current of transistor 13, $I_{c_2}$, similar to Equation 4 above can be written as follows:

$$I_{c_2}=I_{co_2}+\alpha_2I_{e_2} \quad (21)$$

where the subscripts 2 refer the associated quantities to the second transistor 13.

Making the proper substitutions and solving we have:

$$I_{c_2}=\alpha_2S_1I_{co_1}+I_{co_2}+\frac{\alpha_2E(S_1-1)}{R_3} \quad (22)$$

By suitably selecting the stabilizing resistors for transistor 11, as described hereinabove, and by selecting a suitable battery voltage the third term in Equation 22 above, namely the $$\frac{\alpha_2E(S_1-1)}{R_3}$$

term can be made the predominant factor determinative of the collector current $I_{c_2}$ for the transistor 13. Also, since $I_{co_2}$ appears as an additive term in Equation 22, it will be clear that $I_{c_2}$ is relatively independent of variations of $I_{co_2}$, especially at relatively high values of $I_{c_2}$. Furthermore, the degree of independence of $I_{c_2}$ relative to $I_{co_1}$, it will be seen, depends essentially on the stabilization factor $S_1$ for transistor 11, which can be set at relatively low values and at comparatively small cost in power.

For translation of the alternating-current input signal supplied at the terminals 35 (Fig. 1), the emitter 17 of transistor 11 is coupled to the base 21 of transistor 13 through a suitable coupling capacitor 37' and the emitter 23 is appropriately by-passed to ground through a capacitor 39 of any suitable value. The base electrode 21 is returned to ground for direct current through a resistor 41 of any suitable magnitude.

In the operation of the amplifier illustrated in Fig. 1, an alternating current signal applied to the terminals 35 and through capacitor 37 divides between the resistors 29 and 31, in parallel, and the transistor device 11 in proportions corresponding to the relative impedance values of the respective branches. The major portion of the input current is applied to the transistor 11, and in accordance with the presently-accepted theory of operation of transistors, which theory is believed to be sufficiently well known to those skilled in the art so that description here is believed unnecessary, an alternating current $$i_{e_1}$$

is developed in the emitter 17 which is related to the alternating input current to the base electrode $$i_{b_1}$$

as follows:

$$i_{e_1}=\frac{i_{b_1}}{1-\alpha_1}$$

where $\alpha_1$ is the current amplification factor of transistor 11, as above.

The emitter current $$i_{e_1}$$

divides among the paths defined by resistors 27 and 41 and the transistor 13, the principal portion of said emitter current being through the base-emitter circuit of the transistor 13. The change in the collector current $$i_{c_2}$$

of transistor 13 resulting from this emitter current is expressible in accordance with the presently-accepted theory as $$i_{c_2}=\frac{\alpha_2i_{b_2}}{1-\alpha_2}$$

The collector current develops an output voltage across resistor 43 connected between the collector electrode 25 and the negative terminal of a second source of unidirectional voltage, here shown as battery 45, the output voltage being available at terminals 46 as an amplified version of the input signal.

Presently available junction transistors are known to have values of $\alpha$ less than unity and equal to 0.9 or better. Thus, it will be apparent that the current amplifications provided by the separate stages of the above-described amplifier are of the order of 10 or more for the first stage and of 9 or more for the second stage comprising transistor 13. It will, of course, be understood that for transistors having values of amplification factor in excess of 0.9 the respective values of the current amplification for each stage will be correspondingly increased.

In an operative embodiment of the amplifier circuit just described, transistors 11 and 13 having substantially identical current amplification factors and each equal to substantially 0.9 were employed in a circuit having the following constants:

| | | |
|---|---|---|
| Voltage of battery **33** | volts | 19 |
| Voltage of battery **45** | do | 46 |
| Resistance **27** | kilohms | 1 |
| Resistance **29** | do | 60 |
| Resistance **31** | do | 5.4 |
| Resistance **41** | do | 5 |
| Resistance **43** | ohms | 100 |

(The D. C. resistance of a 5000 ohm alternating-current load.)

| | | |
|---|---|---|
| Capacitance **37** | mfd | 2 |
| Capacitance **37'** | mfd | 20 |
| Capacitance **39** | mfd | 50 |

Under the conditions as outlined hereinabove, the amplifier operated to provide current and voltage values as indicated in Table I:

*Table I*

| | Transistor 11 | Transistor 13 |
|---|---|---|
| Base current ........ milliamperes | 1.1 | 1.0 |
| Emitter current ........ do | 12.1 | 11.0 |
| Collector current ........ do | 11.0 | 10.0 |
| Base-collector voltage ........ volts | 2.0 | 50.0 |

From Table I, it can be seen that the voltage across and thus the power developed in the second transistor 13 is considerably greater than the corresponding voltage and power of the first transistor 11. Such a division of power is extremely desirable in view of the fact that it thereby is possible to effect power dissipated in the stabilizing resistors 27, 29 and 31 that is a relatively small portion of the total power dissipated in the amplifier. As a result of the low-power operation of the first stage, the noise factor is maintained at a desirably low level. also, the cost of stabilization measured in terms of power dissipation required for stabilization is minimized.

In operation an amplifier as described above produced a power output into a 5000-ohm alternating current load in excess of 200 milliwatts with an overall efficiency of approximately 35%.

The overall power gain of the amplifier was 35 db of which each stage was observed to contribute substantially equal amounts, and the response of the amplifier was observed to be 6 db down at frequencies of about 50 cycles per second and 10,000 cycles per second.

It is to be clearly understood that the values of circuit parameters set forth above are intended as an illustrative example only and not as any limitation on the scope of the invention. Clearly other suitable values for the circuit parameters can be selected for other desired purposes.

The two-stage amplifier just described may be termed a grounded-collector grounded-emitter amplifier in view of the fact that the collector 19 of the first stage and the emitter 23 of the second stage are grounded through the capacitor 39. The grounded-collector first or input stage is characterized by a very high input impedance and a relatively low voltage amplification.

Where it is desired to obtain higher voltage amplification than that obtainable with the grounded collector input stage at a somewhat lower input impedance in the first stage, the modified form of tandem amplifier, as shown in Figure 3, may be employed in which the first stage is connected to provide a grounded-emitter-amplifier.

In the circuit of Fig. 3, elements similar to those described above in connection with the circuit of Fig. 1 are identified by the same reference numerals.

To provide the grounded-emitter stage, the resistor 27 in the circuit of emitter 17 is by-passed for A. C. by a capacitor 47 and a resistor 49 is connected between the collector 19 and the emitter 23 of the transistor 13. A coupling capacitor 51 is connected in the collector circuit of transistor 11, connecting the collector 19 to base 21 of transistor 13.

With respect to D. C. stabilization, the resistors 27, 29 and 31 are selected in the manner described above and operate in a manner substantially identically with the corresponding circuit described hereinabove in connection with the amplifier of Fig. 1, the collector current from collector 19 being applied D. C.-wise to the emitter 23. So far as the alternating-current operation is concerned, it has been found that the grounded-emitter input stage provides a gain of approximately 4 to 6 db higher than that obtained with the grounded collector stage. The input impedance of the grounded-emitter was noted to be approximately one order of magnitude lower than the corresponding input impedance of the circuit of Fig. 1.

If desired, the output or second stage of the amplifier can be connected to provide grounded-base operation, thereby to provide low input impedance thereto. To this end, as shown in Fig. 4, the resistor 49 of Fig. 3 connected between the collector 19 and the emitter 23 is replaced, in Fig. 4, by a pair of series-connected resistors 53 and 55 connected between the collector 19 and emitter 23, the common junction 57 of the resistors 53, 55 being connected to ground through a capacitor 39. A coupling condenser 59 is connected between collector 19 and emitter 23 to provide A. C. coupling between the stages. Inasmuch as the base electrode 21 need no longer float off ground for A. C., connection to the ground can here be made directly, omitting the resistor 41 employed in the circuit of Fig. 3.

In Fig. 5, a stabilized transistor amplifier circuit is shown which is of the grounded-emitter, grounded-base type generally similar to the circuit illustrated and described above in Fig. 4. In the embodiment of Fig. 5, however, transformer coupling between the first and second stages is employed in place of the resistance-capacitance network of Fig. 4. In this manner, interstage impedance matching can more readily be achieved. Thus, the collector 19 of transistor 11 (Fig. 5) is connected to the emitter 23 of the transistor 13 through primary and secondary windings 61 and 63 of a coupling transformer 65. The windings 61 and 63 can be connected together to form a common D.-C. connection between transistors 11 and 13, the junction 67 of the windings being connected to ground through a capacitor 69, in a manner similar to the grounding of the common junction of the resistors 53 and 55 of Fig. 4.

The modes of operation of the circuits of Figs. 4 and 5 are thought to be apparent in view of the similarity of the stabilization networks employed here and that described in detail in connection with Figs. 1 and 3.

Although I have described transformer coupling between adjacent stages as applied to a grounded-emitter, grounded-base arrangement, it will be understood that such transformer coupling can also be employed in other types of amplifiers described hereinabove with equally efficient operation.

Fig. 6 illustrates a push-pull amplifier constructed in accordance with the teaching of the present invention and embodying the novel features thereof. The amplifier comprises a preamplifier stage *a*, a phase-splitter or phase-inverter stage *b*, and a pair of stabilized tandem chains, A and B, operated in push-pull, as shown at *c*.

The preamplifier stage *a* is adapted to be supplied an input A.-C. signal as from a conventional phonograph reproducer 77, or other transducer, and comprises a transistor device 79 of which the base electrode 81 is connected through a suitable condenser 83 to the transducer 77 for applying the input signal to the device.

Stabilizing resistors 85 and 87 are connected in the base and emitter circuits respectively, the resistors 85 and 87 being grounded as at 89 at their respective terminals remote from the transistor.

In view of the relatively low power of operation of the preamplifier stage, the stabilization provided by the resistors 85 and 87 is found to be adequate without an additional stabilization resistor. It can be shown that for $R_3$ equal to infinity, corresponding to omission of the additional resistor, and for relatively low voltage of operation, satisfactory stabilization can be obtained.

The amplified output signal is supplied from the collector 91 through a coupling condenser 93 to the base electrode 95 of a transistor 97 forming the phase-splitting or phase-inverter stage *b*. To provide a pair of oppositely-phased output currents, the current from the collector electrode 99 is applied through a coupling condenser 101 to a first chain A of stabilized tandem-connected transistors and the current from the emitter electrode 103 is applied through a coupling condenser 105 to a second chain B of similarly stabilized tandem-connected transistors.

It will be observed that the phase-inverter transistor 97 is stabilized by resistors 107, 109 and 111 in the manner set forth in detail hereinabove in connection with the amplifier of Fig. 1.

The chains A and B of stabilized tandem-connected transistors are substantially identical in construction to each other and to the amplifier arrangement of Fig. 1. Accordingly, a complete description here of these branches or of the stabilized phase-inverter stage is deemed unnecessary.

The phases of the currents supplied to the respective base electrodes 113 and 115 of the input transistors 117, 119 of the chains A and B are, of course, in opposition and the magnitudes of these currents can be adjusted to be equal to each other by means of a variable resistor 121 connected between the collector 99 and ground of the phase inverter transistor 97.

The collector electrodes 123 and 125 of the output transistors 127, 129 of the respective chains A and B are connected in push-pull to the primary winding 131 of an output transformer 133 to the secondary terminals 135 of which a utilization device such as a loudspeaker or the like (not shown) can be connected. The center tap 137 of the primary winding 131 is connected to the negative terminal of a source of unidirectional voltage, as, for example, battery 139.

The operation of the push-pull amplifier arrangement is generally similar to the tandem amplifier described hereinabove in connection with the device of Fig. 1 with the result that an output is derived across the output terminals somewhat in excess of twice the output derivable from a single-ended tandem chain.

In an operative embodiment of the push-pull amplifier illustrated in Fig. 6 output power is developed of approximately 3/10 of a watt with 10% distortion, the total power consumption being approximately 1.4 watts.

While certain specific embodiments have been shown and described, it will, of course, be understood that various modifications may be made without departing from the invention. The appended claims are, therefore, intended to cover any such modifications within the true spirit and scope of the invention.

What I claim as new and desire to secure by Letters Patent of the United States is:

1. The combination comprising a first amplifier stage including a first semiconductor device having input, output and common electrodes including a first emitter electrode and a first collector electrode, a second amplifier stage including a second semiconductor device having input, output and common electrodes including a second emitter electrode and a second collector electrode, means coupling a signal to the input and common electrodes of said first semiconductor device, means coupling a signal from the output and common electrodes of said first semiconductor device to the input and common electrodes of said second semiconductor device, means deriving a signal from the output and common electrodes of said second semiconductor device, a source of bias potentials, means direct current conductively coupling said first emitter electrode to one terminal of said source and said second collector electrode to the other terminal of said source respectively, and direct current conductive means coupling said first collector electrode solely to said second emitter electrode.

2. The combination comprising a first amplifier stage including a first semiconductor device having input, output and common electrodes including a first emitter electrode and a first collector electrode, a second amplifier stage including a second semiconductor device having input, output and common electrodes including a second emitter electrode and a second collector electrode, said two semiconductor devices being of the same polarity type and both having a current gain approaching unity, means coupling a signal to the input and common electrodes of said first semiconductor device, means coupling a signal from the output and common electrodes of said first semiconductor device to the input and common electrodes of said second semiconductor device, means deriving a signal from the output and common electrodes of said second semiconductor device, a source of bias potentials, means direct current conductively coupling said first emitter electrode to one terminal of said source and said second collector electrode to the other terminal of said source respectively, and direct current conductive means coupling said first collector electrode solely to said second emitter electrode whereby the magnitudes of the currents flowing through these two last recited electrodes are equal.

3. The combination comprising a first amplifier stage including a first semiconductor device having input, output and common electrodes including a first emitter electrode and a first collector electrode, a second amplifier stage including a second semiconductor device having input, output and common electrodes including a second emitter electrode and a second collector electrode, said two semiconductor devices being of the same polarity type and both having a current gain approaching unity, means coupling a signal to the input and common electrodes of said first semiconductor device, means coupling a signal from the output and common electrodes of said first semiconductor device to the input and common electrodes of said second semiconductor device, means deriving a signal from the output and common electrodes of said second semiconductor device, a source of bias potentials, means direct current conductively coupling said first emitter electrode to one terminal of said source and said second collector electrode to the other terminal of said source respectively, direct current conductive means coupling said first collector electrode solely to said second emitter electrode whereby the magnitudes of the currents flowing through these two last recited electrodes are equal, and means coupled to said first semiconductor device, for stabilizing the operating point thereof.

4. The combination comprising a first amplifier stage including a first semiconductor device having input, output and common electrodes including a first emitter electrode and a first collector electrode, a second amplifier stage including a second semiconductor device having input, output and common electrodes including a second emitter electrode and a second collector electrode, means coupling a signal to the input and common electrodes of said first semiconductor device, means coupling a signal from the output and common electrodes of said first semiconductor device to the input and common electrodes of said second semiconductor device, means deriving a signal from the output and common electrodes of said second semiconductor device, a source of bias potentials, means direct current conductively coupling said first emitter electrode to one terminal of said source and said second collector electrode to the other terminal of said source respectively, direct current conductive means coupling said first collector electrode solely to said second emitter electrode, means coupled to said first semiconductor device for stabilizing the operating point thereof, and means for operating said first semiconductor device at a low power level with relation to said second semi-conductor device.

5. The combination comprising a first amplifier stage having a first semiconductor device with base, emitter and collector electrodes, a second amplifier stage having a second semiconductor device with input, output and common electrodes including a second emitter electrode and a second collector electrode, a source of bias potentials, means direct current conductively coupling said first recited emitter electrode to one terminal of said source and said second collector electrode to the other terminal of said source respectively, direct current conductive means coupling said first recited collector electrodes solely to said second emitter electrode whereby the magnitudes of the currents flowing through these two last recited electrodes are equal, a signal input circuit coupled between the base and collector electrodes of said first semiconductor device, alternating current signal translating means coupled between the emitter and collector electrodes of said first semiconductor device and the input and common electrodes of said second semiconductor device, and an output circuit coupled to the output and common electrodes of said second semiconductor device.

6. The combination comprising a first amplifier stage having a first semiconductor device with base, emitter and collector electrodes, a second amplifier stage having a second semiconductor device with input, output and common electrodes including a second emitter electrode and a second collector electrode, a source of bias potentials, means direct current conductively coupling said first recited emitter electrode to one terminal of said source and said second collector electrode to the other terminal of said source respectively, direct current conductive means coupling said first recited collector electrodes solely to said second emitter electrode whereby the magnitudes of the currents flowing through these two last recited electrodes are equal, a signal input circuit coupled between the base and emitter electrodes of said first semiconductor device, alternating current signal translating means coupled between the collector and emitter electrodes of said first semiconductor device and the input and common electrodes of said second semiconductor device, and an output circuit coupled to the output and common electrodes of said second semiconductor device.

7. The combination as defined in claim 6, wherein said direct current conductive means coupling said first recited collector electrode to said second emitter electrode and said alternating current signal translating means comprise a transformer having primary and secondary windings connected in series direct current-wise.

8. The combination comprising a first amplifier stage having a first semiconductor device with base, emitter and collector electrodes, a second amplifier stage having a second semiconductor device with base, emitter and collector electrodes, a source of bias potentials, means direct current conductively coupling said first recited emitter electrode to one terminal of said source and said second recited collector electrode to the other terminal of said source respectively, direct current conductive means coupling said first recited collector electrode solely to said second recited emitter electrode whereby the magnitudes of the currents flowing through these two last recited electrodes are equal, a signal input circuit coupled between the base and emitter electrodes of said first semiconductor device, signal translating means including said last recited direct current conductive means coupled between the collector and emitter electrodes of said first semiconductor device and the emitter and base electrodes of said second semiconductor device, and an output circuit coupled to the collector and base electrodes of said second semiconductor device.

9. The combination comprising a first amplifier stage having a first semiconductor device with input, output and common electrodes including emitter and collector electrodes, a second amplifier stage including a second semiconductor device having base, emitter and collector electrodes, a source of bias potentials, means direct current conductively coupling said first recited emitter electrode to one terminal of said source and said second recited collector electrode to the other terminal of said source respectively, direct current conductive means coupling said first recited collector electrode solely to said second recited emitter electrode whereby the magnitudes of the currents flowing through these two last recited electrodes are equal, a signal input circuit coupled between the input and common electrodes of said first semiconductor device, means coupling the signal between the output and common electrodes of said first semiconductor device and the base and emitter electrodes of said second semiconductor device, and an output circuit coupled between the collector and emitter electrodes of said second semiconductor device.

10. The combination as defined in claim 9, wherein said signal coupling means comprises a capacitive connection between the collector electrode of said first semiconductor device and the base electrode of said second semiconductor device.

11. The combination as defined in claim 9, wherein said signal coupling means comprises a capacitive connection between the emitter electrode of said first semiconductor device and the base electrode of said second semiconductor device.

12. The combination comprising a first amplifier stage having a first semiconductor device with input, output and common electrodes including emitter and collector electrodes, a second amplifier stage including a second semiconductor device having base, emitter and collector electrodes, a source of bias potentials, means direct current conductively coupling said first recited emitter electrode to one terminal of said source and said second recited collector electrode to the other terminal of said source respectively, direct current conductive means coupling said first recited collector electrode solely to said second recited emitter electrode whereby the magnitudes of the currents flowing through these two last recited electrodes are equal, a signal input circuit coupled between the input and common electrodes of said first semiconductor device, means coupling the output and common electrodes of said first semiconductor device to the emitter and base electrodes of said second device, and an output circuit coupled between the collector and base electrodes of said second semiconductor device.

References Cited in the file of this patent

UNITED STATES PATENTS

| | | |
|---|---|---|
| 2,517,960 | Barney et al. | Aug. 8, 1950 |
| 2,531,076 | Moore | Nov. 21, 1950 |
| 2,585,078 | Barney | Feb. 12, 1952 |
| 2,647,957 | Mallinckrodt | Aug. 4, 1953 |
| 2,647,958 | Barney | Aug. 4, 1953 |
| 2,666,817 | Raisbeck et al. | Jan. 19, 1954 |
| 2,680,160 | Yaeger | June 1, 1954 |
| 2,693,568 | Chase | Nov. 2, 1954 |
| 2,730,576 | Caruthers | Jan. 10, 1956 |

OTHER REFERENCES

"The Transistor," article in Electronics, September 1948, pages 68–71.

"The Transistor," pages 144, 152–155, 188, 348–356, 370–373, pub. 1951 by Bell Telephone Lab's. Inc., N. Y.

Article by Doremus in Radio and Television News, April 1952, pages 14–20.